United States Patent
Donelly et al.

(10) Patent No.: US 6,948,143 B2
(45) Date of Patent: Sep. 20, 2005

(54) CONSTRAINED OPTIMIZATION WITH LINEAR CONSTRAINTS TO REMOVE OVERLAP AMONG CELLS OF AN INTEGRATED CIRCUIT

(75) Inventors: Ross A. Donelly, Sunnyvale, CA (US); William C. Naylor, San Jose, CA (US); Jason R. Woolever, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 201 days.

(21) Appl. No.: 10/434,737

(22) Filed: May 9, 2003

(65) Prior Publication Data

US 2004/0225982 A1 Nov. 11, 2004

(51) Int. Cl.[7] .............................. G06F 9/45; G06F 17/50
(52) U.S. Cl. ............................... 716/9; 716/10; 716/12
(58) Field of Search ........................... 716/9, 10, 12–15

(56) References Cited

U.S. PATENT DOCUMENTS

| | | | | |
|---|---|---|---|---|
| 5,619,419 A | * | 4/1997 | D'Haeseleer et al. | 716/8 |
| 6,480,991 B1 | * | 11/2002 | Cho et al. | 716/8 |
| 6,507,938 B1 | * | 1/2003 | Roy-Neogi et al. | 716/10 |
| 6,629,304 B1 | * | 9/2003 | Gasanov et al. | 716/10 |
| 2003/0182649 A1 | * | 9/2003 | Harn | 716/11 |
| 2004/0040007 A1 | * | 2/2004 | Harn | 716/11 |

* cited by examiner

Primary Examiner—A. M. Thompson
Assistant Examiner—Magid Y. Dimyan
(74) Attorney, Agent, or Firm—Park, Vaughan & Fleming, LLP

(57) ABSTRACT

A method and system of constrained optimization with linear constraints to remove overlap among cells of an integrated circuit. A coarse placement using well known methods may provide an initial placement of cells. Overlapping cells are separated. Any cell moved to its initial placement may be fixed so as not to be moved during subsequent placements. A plurality of linear inequalities representing allowable placements of a plurality of cells of a layout is generated. An objective function measuring cell movement subject to the constraints of the plurality of inequalities is minimized. The objective function minimizes cell movement from the initial cell placement. In this novel manner, large and small cells may be automatically simultaneously placed, deriving speed and quality advantages over prior art methods.

16 Claims, 7 Drawing Sheets

CONSTRAINED OPTIMIZATION WITH LINEAR CONSTRAINTS TO REMOVE OVERLAP AMONG CELLS OF AN INTEGRATED CIRCUIT

FIELD OF THE INVENTION

Embodiments of the present invention relate to the field of electronic design automation (EDA). More particularly, embodiments of the present invention relate to computer implemented processes for cell placement and other optimizations used in the design and fabrication of integrated circuit devices.

BACKGROUND ART

The rapid growth of the complexity of modern electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually.

One of the most difficult, complex and time-consuming tasks in the design process is known as cell placement, or more simply "placement." The placement problem is the assignment of a collection of connected cells to positions in a 2-dimensional arena, such that objective functions such as total wire length are minimized.

Conventionally, both the X and Y coordinates of the cells are determined simultaneously. There are many well known tools commercially available to accomplish this task, for example, the "Physical Compiler" commercially available from Synopsys of Mountain View, Calif.

Modern chip design methods often involve combining both large design elements with smaller design elements. For example, a large element may be a random access memory, or RAM, which may be designed by an automated memory compiler. Other examples of large design elements include intellectual property blocks, or "IP blocks." Such IP blocks may implement complex functions, for example a processor core or a UART, which were designed previously and made available for integration into future designs.

The smallest design element is typically a cell, which may implement a basic logic function, for example a NAND gate. Such cells may be used to integrate existing IP or memory blocks together, and/or to implement new designs.

It is not unusual for a large element to be three to six orders of magnitude larger than the smallest elements. For example, it is not uncommon for a RAM block or cell to comprise a chip area equivalent to the area of 75,000 to 100,000 individual cells.

Unfortunately, simultaneous placement of such large cells with numerous small cells has generally not been successful in prior art automatic placers. The prior art design process for a chip containing such large blocks or cells typically involves several stages of manual intervention to locate and fix in place such large cells, while removing illegal overlap conditions with many, perhaps thousands, of small cells. Such manual involvement in design processes may be described as more of an art than a science. Further, manual intervention generally lengthens the design duration, requires highly skilled people, is inconsistent and generally not as optimized as a fully automated process.

Therefore, for these reasons and more, an automatic method of removing overlap among cells is highly desired. Such a method would have wide application in almost every area of integrated circuit application, including ASICs, systems on a chip (SOC), gate arrays and more.

SUMMARY OF THE INVENTION

Embodiments of the present invention enable the simultaneous placement of both large and small cells in an integrated circuit design. Further embodiments of the present invention utilize constrained optimization with linear constraints to remove overlap among cells of an integrated circuit. Still further embodiments of the present invention exploit a sequential nature of processing cells to solve a system of relations in a very efficient manner.

A method and system of constrained optimization with linear constraints to remove overlap among cells of an integrated circuit are disclosed. A coarse placement using well known methods may provide an initial placement of cells. Overlapping cells are separated. Any cell moved to its initial placement may be fixed so as not to be moved during subsequent placements. A plurality of linear inequalities representing allowable placements of a plurality of cells of a layout is generated. An objective function measuring cell movement subject to the constraints of the plurality of inequalities is minimized. The objective function minimizes cell movement from the initial cell placement. In this novel manner, large and small cells may be automatically simultaneously placed, deriving speed and quality advantages over prior art methods.

DETAILED DESCRIPTION OF THE INVENTION

Figure 1:
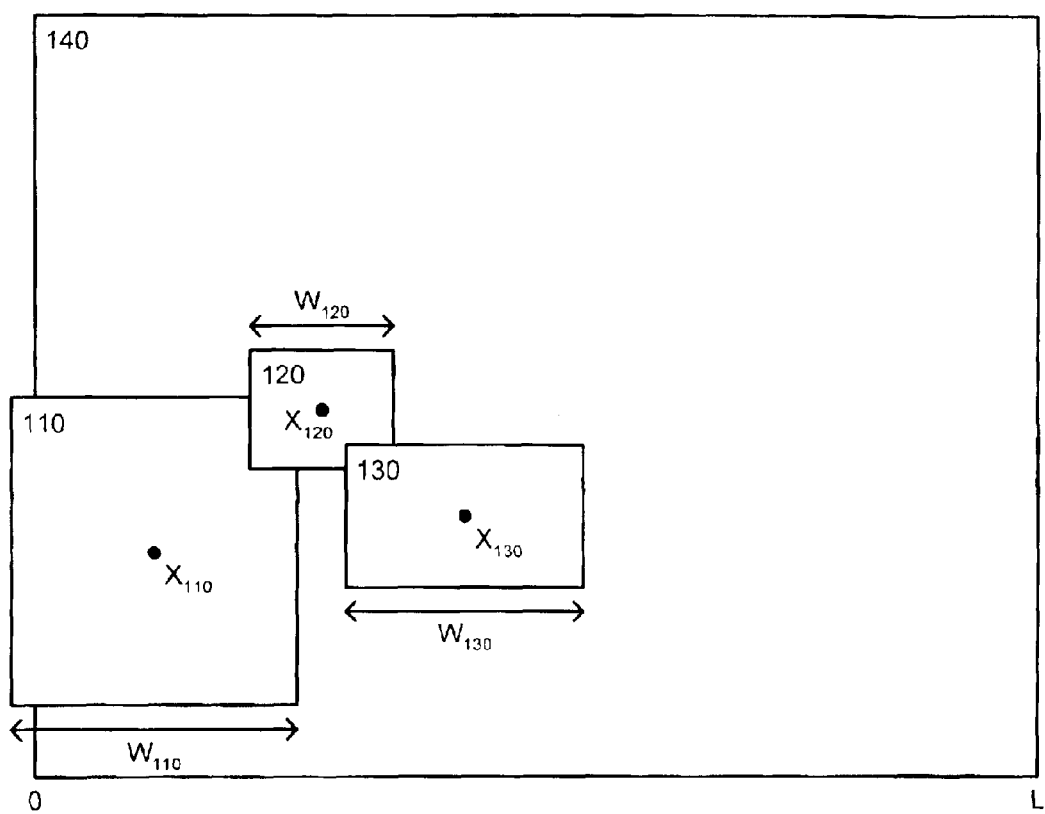
FIG. 1 is a placement diagram that illustrates an exemplary result of an initial cell placement.

In the following detailed description of the present invention, constrained optimization with linear constraints to remove overlap among cells of an integrated circuit, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., processes 200, 240 and 240') are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "selecting" or "moving" or "repeating" or "combining" or "testing" of "setting" or "increasing" or "transforming" or "determining" or "optimizing" or "synthesizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Constrained Optimization with Linear Constraints to Remove Overlap Among Cells of an Integrated Circuit Embodiments of the present invention are described in the context of the field of electronic design automation (EDA). More particularly, embodiments of the present invention relate to techniques for cell placement and other optimizations used in the design and fabrication of integrated circuit devices. It is appreciated, however, that elements of the present invention may be utilized in the design and fabrication of other types of circuits, for example printed wiring boards.

The functional design of an electronic integrated circuit specifies the cells (individual functional elements) that compose the circuit and which pins of which cells are to be connected together using wires ("nets"). Typically, much or all of the design of an integrated circuit is specified in a high level language, for example "HDL." Though a process of computer implemented synthesis, or "synthesizing," high level constructs are converted into cells and nets.

"Placement" or "placing" generally refers to the important step of assigning a physical location, typically in two dimensions, in the process of physically implementing the electronic circuit, for example in an integrated circuit or on a printed wiring board.

Reference is hereby made to U.S. Pat. No. 6,282,693, "Non-linear Optimization System and Method for Wire Length and Density within an Automatic Electronic Circuit Placer," which is incorporated herein by reference in its entirety.

Reference is hereby made to U.S. Pat. No. 6,301,693, "Non-linear Optimization System and Method for Wire Length and Delay Optimization for an Automatic Electronic Circuit Placer," which is incorporated herein by reference in its entirety.

FIG. 1 is a placement diagram that illustrates an exemplary result of an initial cell placement. More specifically, a conventional placement process has attempted to place cells 110, 120 and 130 within chip area 140. Cell 120 partially overlaps cell 110 and also partially overlaps cell 130. A portion of Cell 110 is outside of chip area 140. This initial placement of cells is "illegal." For example, this placement would not function correctly if actually manufactured. In order to produce a realizable design, the cell placement should be "legalized." A "legal" cell placement meets the manufacturing design rules for consistent manufacturability. One typical such design rule is that cells do not overlap.

An initial placement has typically been optimized for some objective function, for example to minimize wiring length and/or to maximize clock rate for the design. It is consequently desirable to minimize displacement from an initial placement during subsequent legalization processing so as to retain as much of the initial optimization as possible.

A method to remove overlaps among cells may construct directed acyclic graphs for each linear dimension (e.g., "X" and "Y" dimensions) to describe the set(s) of placement conditions of the many cells that result in no overlaps, according to an embodiment of the present invention. For example, to remove vertical overlap between cells 110 and 120 in FIG. 1, the top edge or "Y" coordinate of cell 120 should be lower than then bottom edge or "Y" coordinate of cell 110.

Within a single dimension, removing illegal overlap while minimizing displacement from an initial placement may be framed as a quadratic programming problem, according to an embodiment of the present invention. In an alternative embodiment of the present invention, this problem may also be framed as a linear programming problem. Linear programming techniques may produce somewhat less optimized placements in exchange for faster execution, for example.

The constraints to remove overlap may be formed as a set of linear inequalities, according to an embodiment of the present invention. Consider removing overlap in the X, or horizontal dimension. It is appreciated that removing overlap in the Y (vertical) dimension may use an analogous method, according to an embodiment of the present invention.

Referring to FIG. 1 once again, assign X=0 to the left edge of chip area 140, and X=L to the right edge of chip area 140. Assign the X coordinate of the center of cell 110 to be $X_{110}$, Similarly, assign the X coordinates of cells 120 and 130 to be $X_{120}$ and $X_{130}$ respectively. Likewise, assign the horizontal extent, or width, of cells 110, 120 and 130 to be $W_{110}$, $W_{120}$ and $W_{130}$. It is to be appreciated that embodiments of the present invention are well suited to other methods of assigning geographic coordinates to cells, for example anchoring a point to the lower left hand corner of a cell.

Some constraints which are necessary to produce a legal placement are that the center of cell 110 should be at least one half of cell 110's width from the origin along the X axis and the left edge of cell 120 should be at least one half of cell 110's width from the center of cell 110 along the X axis. According to an embodiment of the present invention, these constraints may be expressed in quadratic programming terms as:

$$X_{110} - 0.5 W_{110} \geq 0 \quad \text{(Relation 1)}$$

and $$X_{120} - 0.5 W_{120} \geq X_{110} + 0.5 W_{110} \quad \text{(Relation 2).}$$

Relation 2 may be regrouped to form Relation 3.

$$X_{120} - 0.5 W_{120} - (X_{110} + 0.5 W_{110}) \geq 0 \quad \text{(Relation 3).}$$

It is to be appreciated that similar constraints may be constructed for cell 130 and other cells (not shown). Preferably, constraints are also constructed for cells which neither overlap other cells nor are overlapped by other cells. The initial (legal) position of such cells may become illegal as other cells are adjusted. In such a case, their adjusted positions will need to be legalized as well.

In order to more clearly present elements of the present invention, other physical constraints on cell placement, for example wiring channels, are excluded from the present discussion. It is to be appreciated, however, that other physical design requirements may be represented in an analogous fashion and are well suited to embodiments of the present invention.

Although it is possible that there is no solution to the set of inequalities describing legal placement (e.g., there is not enough room on the chip for all of the cells), in general there will be many solutions. In graphical terms, the set of inequal relations defines an area rather than a point. In order to select an optimal solution from among a set of solutions, optimization criteria should be determined. One such optimization criterion is to minimize cell displacement or movement from an initial placement. A further optimization is to weight the movement of a cell by the area of a cell. It is to be appreciated that embodiments of the present invention are well suited to other optimizations.

In quadratic programming terms, the above constraints may be constructed as finding the minimum of Relation 4, below, according to an embodiment of the present invention. Relation 4 is an objective function minimizing movement.

$$\text{minimum movement} = A_{110}(X_{110} - X_{110start})^2 + A_{120}(X_{120} - X_{120start})^2 + \quad \text{(Relation 4)}$$

where $A_{cell}$ is the area weighting of a particular cell, $X_{cell}$ is the X coordinate of a new cell position and $X_{cell-start}$ is the initial coordinate of the cell. It is to be appreciated that embodiments of the present invention are well suited to different order objective functions, e.g., cubing the displacement.

Alternatively, an objective function minimizing movement may be formed in terms of the absolute value of displacement, or the difference between an initial position and a new position, according to an embodiment of the present invention. Relation 5 below is an example of such a formulation.

$$\text{minimum movement} = A_{110}|X_{110} - X_{110start}| + A_{120}|X_{120} - X_{120start}| + \quad \text{(Relation 5)}$$

In linear programming terms, the above constraints may be constructed as finding the minimum of a linear relation, according to an embodiment of the present invention. In a well known linear programming operation, a "slack variable" is introduced to incorporate an inequal constraint into an equality relation. Let Vcell be such a slack variable.

$$V_{cell} \geq X_{cell} - X_{cell-start} \quad \text{(Relation 6)}$$

and $$V_{cell} \geq -(X_{cell} - X_{cell-start}) \quad \text{(Relation 7)}$$

Then a linear equality relation may become the constraint as shown in Relation 8, below.

$$\text{minimum movement} = A_{110} V_{110} + A_{120} V_{120} + \quad \text{(Relation 8)}$$

There is a wide range of well known methods to solve quadratic and linear programming problems. By this novel formulation of the problem of removing overlap among cells in an initial integrated circuit placement, the heretofore difficult problem of removing cell overlap may be solved via well known automated methods.

One well known method of representing both quadratic and linear programming formulations of a problem is known as a reduced matrix formulation. According to an embodiment of the present invention, reduced matrix techniques may be used to solve a constrained optimization with linear constraints.

In general linear or quadratic programming, the relations take the form of a "Tableaux." A Tableaux is a matrix inequality of the form [M]≧[C], where [C] is a vector of constants that represent the constraints. The first row of matrix [M] is the objective. A series of matrix pivot operations are used to solve for the various variables. For many problems, many of the entries in matrix [M] may be zero, e.g., matrix [M] is sparse, and reduced matrix methods may be employed. Reduced matrix methods are typically application specific. According to an embodiment of the present invention, the problem of removing cell overlap in an integrated circuit may be solved using reduced matrix methods.

Figure 2A:
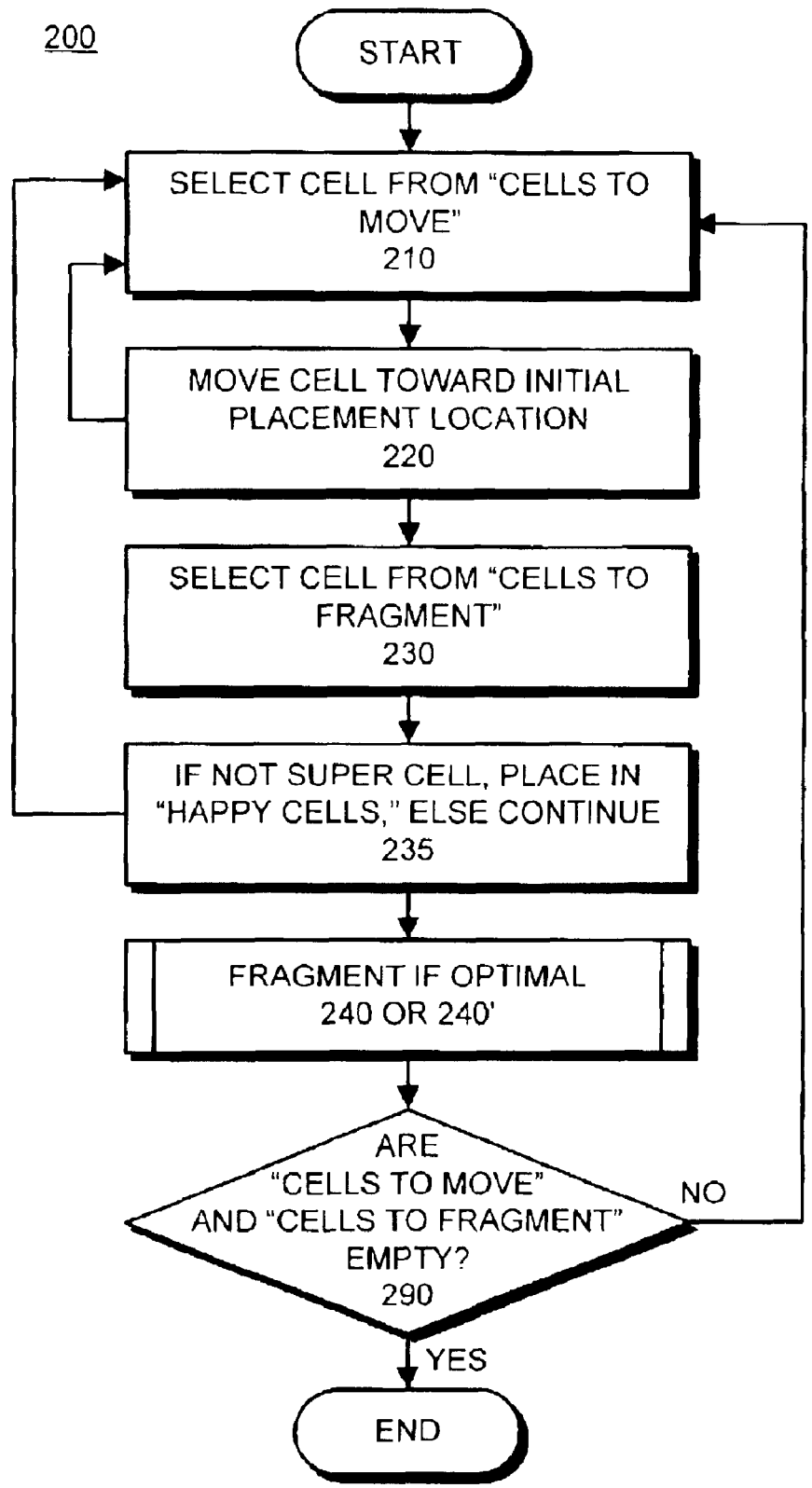
FIG. 2A illustrates a flow diagram of a computer implemented method of optimizing a placement of cells of an integrated circuit, according to an embodiment of the present invention.

FIG. 2A illustrates a flow diagram of a computer implemented method 200 of optimizing a placement of cells of an integrated circuit, according to an embodiment of the present invention. Process 200 may operate on an initial placement of cells in a design containing overlapping cells. The initial placement may have been produced by any well known placement tool, including, for example, Physical Compiler, commercially available from Synopsys of Mountain View, Calif.

In an initial step (not shown), three queues for storing cells (or for storing identification information of cells) are established. The three queues are "cells to move," "cells to fragment" and "happy cells." Cells in the "happy cells" queue are in their optimal location. Their position is fixed and they will not be subsequently moved. Initially, all cells are in the "cells to move" queue, and the other queues are empty. It is appreciated that the exemplary queue names are illustrative and that embodiments of the present invention are well suited to other methods of identifying such queues.

In step 210, a cell is chosen from the "cells to move" queue. Embodiments of the present invention are well suited to a wide variety of methods for selecting a cell from a queue, for example selecting the first item in the queue. Preferably, the cell with the largest weighted displacement from initial position value is selected.

In step 220, the selected cell is moved (in one dimension) toward its starting location. If the cell is moved to its initial location, then the cell is moved into the "cells to fragment"

queue. If, in the course of movement toward its initial position, a cell abuts or "runs into" another cell, then movement of that cell is stopped. The moved (selected) cell and the abutting cell are merged into a "super cell." Information of the super cell comprises information of the constituent cells and the geographic relationship(s) of the cells. A super cell may comprise two or more original or constituent cells. The newly formed super cell is placed into the "cells to move" queue.

In step 230, a cell in the "cells to fragment" queue is selected for fragmentation, or division into two or more parts. Note that the division of a super cell may, but does not necessarily, divide the super cell into the original constituent cells, according to an embodiment of the present invention. For example, a super cell formed from three cells A, B and C may be divided into cell A and a new super cell comprising B and C.

In step 235 if the selected cell is not a super cell, then it can not be fragmented and it is placed in the "happy cells" queue. Process flow resumes at step 210. If the selected cell is a super cell, process flow continues at step 240 or 240', which determine if fragmentation is desirable. It may not be optimal to fragment or divide a super cell. Methods to decide if a super cell should be fragmented will be described in detail below.

In step 290, process 200 tests for a termination condition. If the "cells to move" queue AND the "cells to fragment" queues are both empty, then the process is complete. If either queue contains cells, then process flow transfers to step 210.

A cell may not be fragmented if it is not a super cell. A cell selected for fragmentation that is not fragmentable is placed into the "happy cells" queue. It is to be appreciated that a super cell will not necessarily be fragmented. A super cell may not be fragmented if it is optimal to leave the constituent cells abutting.

Cells that are fragmented are divided into the constituent cells but are not moved. The constituent cells are placed into the "cells to move" queue.

Figure 3:
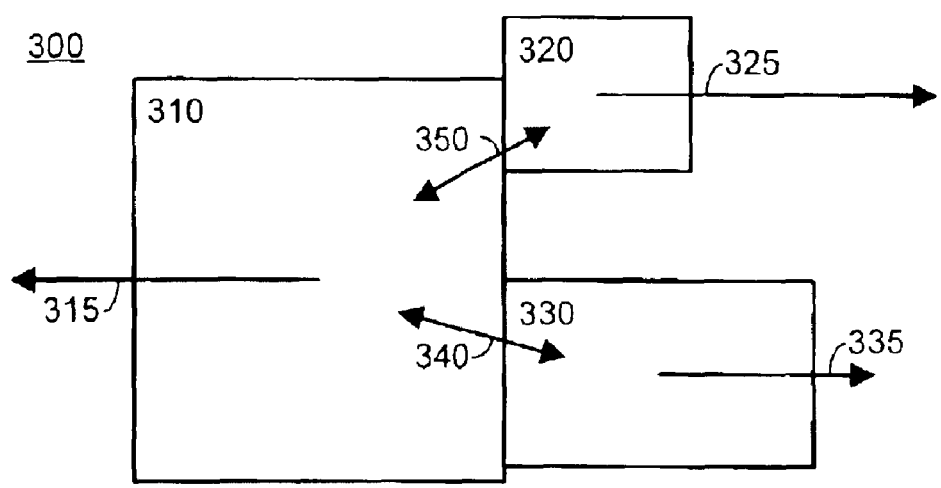
FIG. 3 illustrates a super cell, according to an embodiment of the present invention.

FIG. 3 illustrates a super cell 300, according to an embodiment of the present invention. Super cell 300 is comprised of cells 310, 320 and 330. Super cell 300 is generally located somewhere within a chip area, for example chip area 140 of FIG. 1.

It is convenient to model super cell 300 as being held together by various spring forces. It is appreciated that there is no physical basis in this model. However, such a model is employed to more clearly illustrate embodiments of the present invention.

In general, none of the constituent cells of a super cell will be located in their original, initial positions. Consequently, there is some "pull" toward a cell's original position. This "pull" is modeled as spring forces 315, 325 and 335. Spring force 315 is influencing cell 310 to move to cell 310's initial position. Likewise, spring force 325 is pulling cell 320 toward its initial position and spring force 335 is pulling cell 330 toward its initial position. It is appreciated that the pull force may have a direction toward other constituent cells in a super cell.

In previous processing, for example in process 200, cells 310, 320 and 330 were combined into a super cell. Consequently, there is some influence holding the cells together or keeping them apart. Such influences are again modeled as springs between the cells. Inter-cell force 350 acts between cells 310 and 320, and inter-cell force 340 acts between cells 310 and 330. It is to be appreciated that inter-cell forces may act to pull cells together or to push them apart.

Finding a point of rest for a multi-spring system may be viewed as finding the point at which the energy of the spring system is zero. It is appreciated that performing a test for fragmentation implies that a super cell is in an optimal position as a super cell, since the "cells to move" queue is empty. As the super cell in its entirety is optimally placed, there is no net force acting upon it. Consequently, the sum of the spring forces, e.g., spring forces 315, 325, 335, 340 and 350, acting upon the constituent cells should be zero. This condition for cell 310 may be represented as shown in Relation 9, below.

$$F315+F350+F340=0 \qquad \text{(Relation 9)}$$

Relation 9 comprises one component due to the cell's displacement from an initial placement and a plurality of components due to contact points with other constituent cells. Spring force 315 (pull to initial location) may be expressed as the derivative with respect to X of spring energy, $(1/2)A_{310}(X_{310}-X_{310\text{-}start})$, where $A_{310}$ is the area of cell 310, used as a weighting factor.

Similarly, corresponding relations may be established for the other constituent cells in the super cell. The system of relations may be solved for the inter-cell forces, e.g., spring force 350 and spring force 340 via well known methods, for example a standard "matrix solver" software package.

Inter-cell forces may act to pull cells together or to push them apart. For any inter-cell forces which work to pull adjacent constituent cells together, the objective function will be reduced if the two constituent cells are separated. Consequently, the super cell is fragmented at the contact point corresponding to the inter-cell force. If more than one inter-cell force is determined to be holding cells together, the super cell is fragmented at the contact point corresponding to the largest force. The resulting fragments are placed into the "cells to move" queue.

Figure 2B:
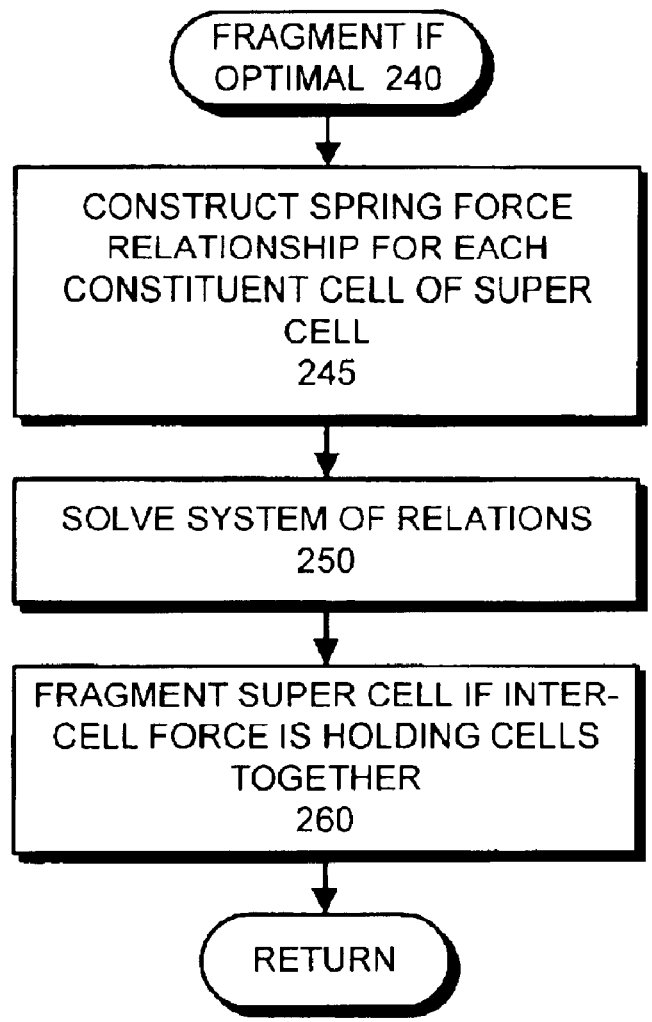
FIG. 2B illustrates a flow diagram of a computer implemented method of determining how a super cell should be fragmented, according to an embodiment of the present invention.

FIG. 2B illustrates a flow diagram of a computer implemented method 240 of determining how a super cell should be fragmented, according to an embodiment of the present invention.

In step 245, a spring force relationship for each constituent cell of a super cell is constructed.

In step 250, the system of relationships is solved for the unknown inter-cell forces.

In step 260, a super cell is fragmented if an inter-cell force is holding two constituent cells together.

In this novel manner, the inter-cell forces may be determined. With information of inter-cell forces, super cells may be optimally fragmented with the beneficial result of a more optimal placement of all cells within a design.

Solving a system of linear equations generally requires a time duration that is proportional to the cube (third power) of the number of variables. Consequently, the method of determining how a super cell should be fragmented previously described will run in a time proportional to the number of constituent cells cubed for each super cell to be tested for fragmentation. In many integrated circuit designs, such "n-cubed" time is undesirable.

According to an alternative embodiment of the present invention, characteristics of the set of linear relations representing spring forces may be exploited in order to solve for the inter-cell forces in a much faster and more efficient manner.

Figure 4:
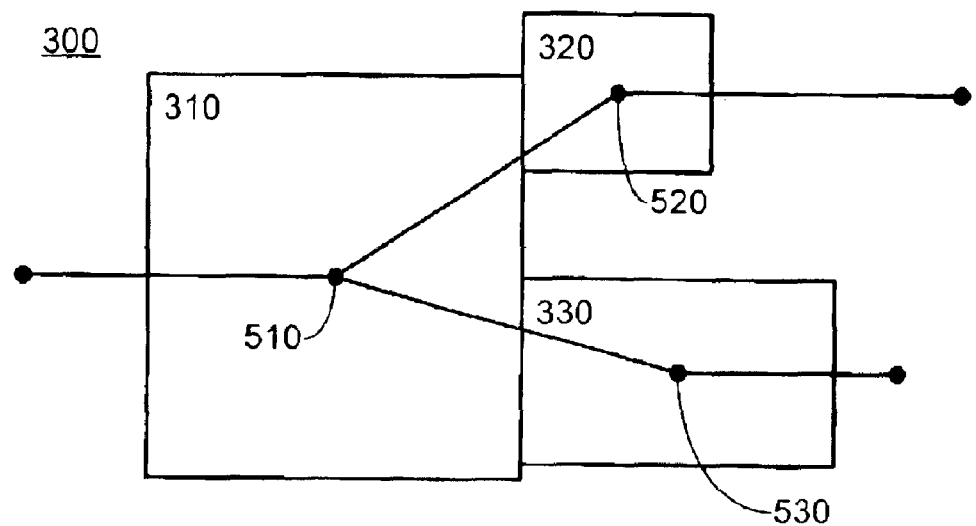
FIG. 4 illustrates spring forces acting upon a super cell as a spanning tree graph, according to an embodiment of the present invention.

FIG. 4 illustrates spring forces acting upon a super cell 300 as a spanning tree graph, according to an embodiment of the present invention. The "springs" of FIG. 3 have been replaced by branches of a tree graph.

Figure 5:
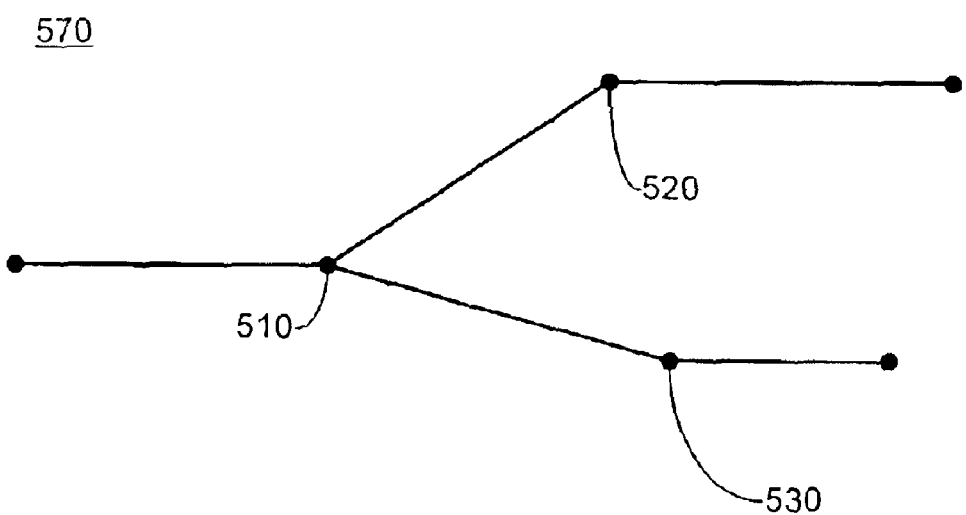
FIG. 5 illustrates a resulting spanning tree graph as a stand-alone data structure.

FIG. 5 illustrates the resulting spanning tree graph 570 as a stand-alone data structure that can be represented in computer memory. Node 510 represents cell 310, node 520 represents cell 320 and node 530 represents cell 330. Each node of the graph comprises information of pull force for a cell (a pull toward its initial location) and inter-cell forces acting upon that cell. For example, node 530 comprises information of the forces acting upon cell 310 (FIG. 3) of force 335 pulling cell 330 toward its original location and inter-cell force 340.

It is to be appreciated that a graph so constructed is acyclic. Due to the sequential nature of forming super cells, for example within process 200, abutment between cells proceeds in sequence. Consequently, a super cell is formed between two cells, or a cell and a previously existing super cell. A super cell is never formed in which all constituent cells touch at least two other constituent cells.

Graph 370 may be traversed starting at a "leaf" node. A leaf node is an end node representing a cell at an edge of a super cell, for example node 530. As described previously, the forces acting upon cell 330 should be in equilibrium. Consequently, the pull force and the single inter-cell force (force 340 of FIG. 3) should be equal in magnitude and opposite in direction.

Since the pull force is known, the inter-cell force is readily determined. The pull force of other leaf nodes may similarly be used to determine the inter-cell force of the corresponding cells. After determining the inter-cell forces of all leaf nodes, the inter-cell forces of any non-leaf or interior nodes, e.g., node 510, may be determined by well known methods.

Figure 2C:
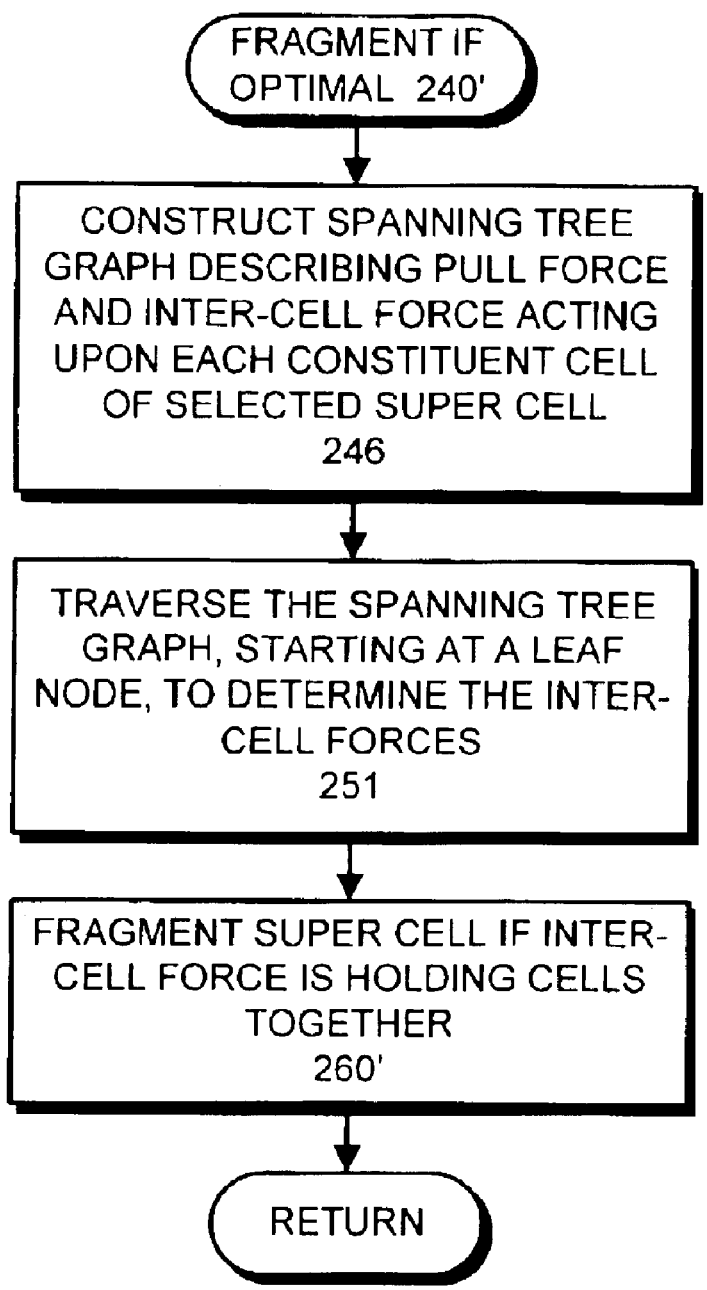
FIG. 2C illustrates a flow diagram of a computer implemented method of determining how a super cell should be fragmented, according to an embodiment of the present invention.

FIG. 2C illustrates a flow diagram of a computer implemented method 240' of determining how a super cell should be fragmented, according to an embodiment of the present invention.

In step 246, a spanning tree graph is constructed describing the pull force and inter-cell forces acting upon each constituent cell of the selected super cell.

In step 251, the spanning tree graph is traversed, stating at a leaf node, to determine the unknown inter-cell forces.

In step 260', a super cell is fragmented if an inter-cell force is holding two constituent cells together. As described previously, inter-cell "forces" may act to pull cells together or to push them apart. In steps 246 and 251, such forces are determined. If an inter-cell force is determined to be such that constituent cells are held together, they should be allowed to separate in order to form a more optimum cell placement.

In this novel manner, the inter-cell forces may be determined far more quickly and with more efficient use of computer or other resources than through solving a set of simultaneous relationships. With information of inter-cell forces, super cells may be optimally fragmented with the beneficial result of a more optimal placement of all cells within a design.

Figure 6:
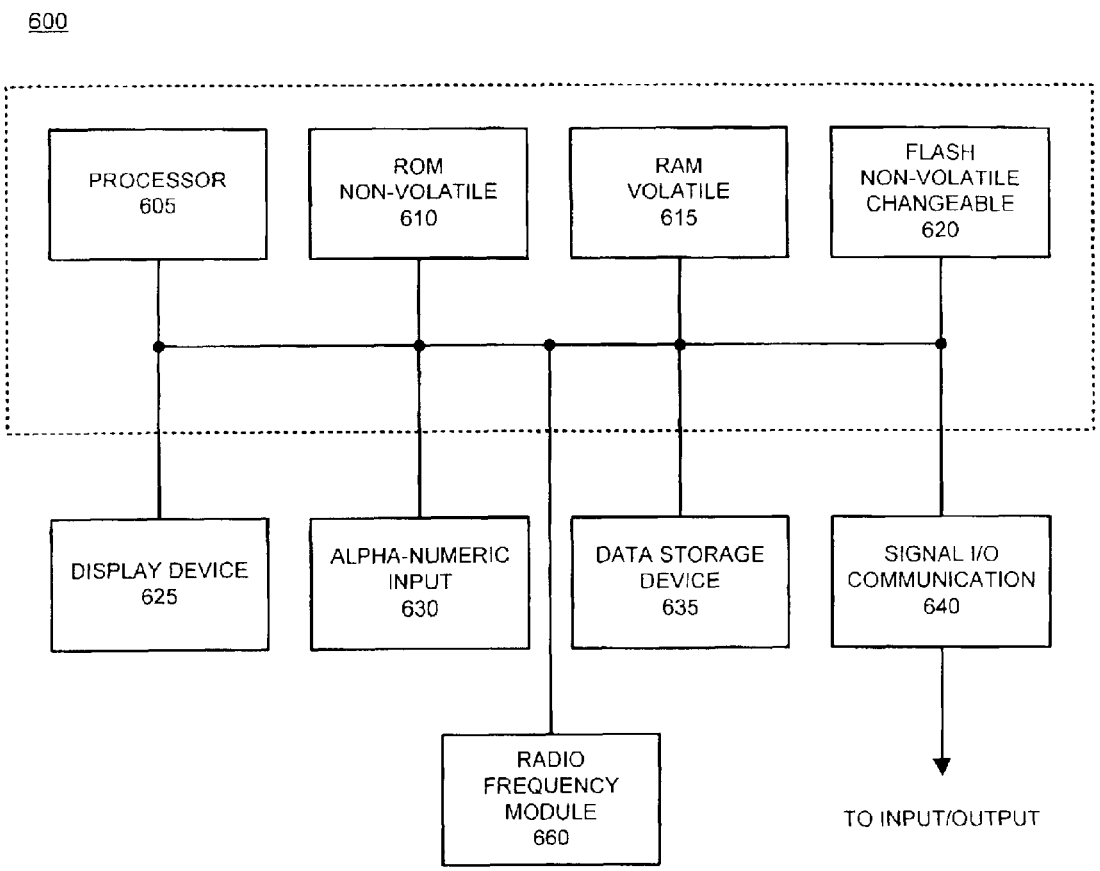
FIG. 6 illustrates circuitry of computer system, which may form a platform for the implementation of embodiments of the present invention.

FIG. 6 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a non-volatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 6 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or Bluetooth.

Embodiments of the present invention enable the simultaneous placement of both large and small cells in an integrated circuit design. Further embodiments of the present invention utilize constrained optimization with linear constraints to remove overlap among cells of an integrated circuit. Still further embodiments of the present invention exploit a sequential nature of processing cells to solve a system of relations in a very efficient manner.

The preferred embodiment of the present invention, constrained optimization with linear constraints to remove overlap among cells of an integrated circuit, is thus described. While the present invention has been described in particular embodiments, it should be appreciated that the present invention should not be construed as limited by such embodiments, but rather construed according to the below claims.

What is claimed is:

1. A computer implemented method for placing circuit elements of an integrated circuit design comprising:
   accessing a layout of said design with an initial cell placement;
   generating a plurality of linear inequalities to represent allowable placements of a plurality of cells of a layout to remove cell overlap; and
   minimizing an objective function measuring cell movement subject to constraints of said plurality of inequalities to arrive at a new cell placement, said objective function minimizing cell movement from said initial cell placement, wherein said minimizing comprises using reduced matrix methods to solve said objective function subject to said constraints.

2. The method of claim 1 wherein said minimizing comprises solving said objective function subject to said constraints using quadratic programming, wherein said objective function is a quadratic expression.

3. The method of claim 1 wherein said minimizing comprises solving said objective function subject to said constraints using linear programming.

4. The method of claim 1 further comprising combining cells into
   a multi-cell entity when movement of said cells causes said cells to abut.

5. The method of claim 4 further comprising determining if fragmenting said multi-cell entity reduces said objective function.

6. The method of claim 5 wherein said determining further comprises solving a set of linear relations.

7. The method of claim 5 wherein said determining further comprises traversing a tree structure.

8. The method of claim 5 further comprising fragmenting said multi-cell entity to reduce said objective function.

9. A computer readable medium comprising instructions which when executed by a computer system causes said computer system to implement a process comprising:

accessing a layout of said design with an initial cell placement;

generating a plurality of linear inequalities to represent allowable placements of a plurality of cells of a layout to remove cell overlap; and minimizing an objective function measuring cell movement subject to constraints of said plurality of inequalities to arrive at a new cell placement, said objective function minimizing cell movement from said initial cell placement, wherein said minimizing comprises using reduced matrix methods to solve said objective function subject to said constraints.

10. The computer readable medium of claim 9 wherein said minimizing comprises solving said objective function subject to said constraints using quadratic programming, wherein said objective function is a quadratic expression.

11. The computer readable medium of claim 9 wherein said minimizing comprises solving said objective function subject to said constraints using linear programming.

12. The computer readable medium of claim 9 further comprising combining cells into a multi-cell entity when movement of said cells causes said cells to abut.

13. The computer readable medium of claim 12 further comprising determining if fragmenting said multi-cell entity reduces said objective function.

14. The computer readable medium of claim 13 wherein said determining further comprises solving a set of linear relations.

15. The computer readable medium of claim 13 wherein said determining further comprises traversing a tree structure.

16. The computer readable medium of claim 13 further comprising fragmenting said multi-cell entity to reduce said objective function.

* * * * *